United States Patent

Gosain et al.

[11] Patent Number: 5,953,595
[45] Date of Patent: Sep. 14, 1999

[54] METHOD OF MANUFACTURING THIN FILM TRANSISTOR

[75] Inventors: Dharam Pal Gosain; Jonathan Westwater; Miyako Nakagoe; Setsuo Usui, all of Kanagawa, Japan

[73] Assignee: Sony Corporation, Tokyo, Japan

[21] Appl. No.: 08/721,948

[22] Filed: Sep. 27, 1996

[30] Foreign Application Priority Data

Sep. 29, 1995 [JP] Japan ................................. 7-253820
Aug. 6, 1996 [JP] Japan ................................. 8-207161

[51] Int. Cl.$^6$ ................................................. H01L 21/00
[52] U.S. Cl. ......................... 438/158; 438/158; 438/162; 438/166; 438/301; 438/487; 438/753; 438/949
[58] Field of Search .................... 438/158, 162, 438/166, 301, 487, 753, 949

[56] References Cited

U.S. PATENT DOCUMENTS

| 3,481,031 | 12/1969 | Klasens ................................. 438/158 |
| 4,109,029 | 8/1978 | Ozdemir et al. ........................ 438/949 |
| 4,253,888 | 3/1981 | Kikuchi .................................... 438/949 |
| 4,414,059 | 11/1983 | Blum et al. ............................. 438/949 |
| 4,685,195 | 8/1987 | Szydlo et al. .......................... 438/949 |
| 4,700,458 | 10/1987 | Suzuki et al. ........................... 438/949 |
| 5,454,901 | 10/1995 | Tsuji ....................................... 438/753 |

FOREIGN PATENT DOCUMENTS

| 0 322 590 | 1/1988 | European Pat. Off. . |
| 58-119669 | 8/1982 | Japan . |

OTHER PUBLICATIONS

Patent Abstracts of Japan, vol. 7, No. 229 (E–203), Dec. 10, 1983, and JP58119669, (Suwa Seikosha KK), Jul. 16, 1983.
Proceedings of the SID, vol. 30, No. 2, Jan. 1, 1989, pp. 143–146, XP000114037, Yuki M et al, "A Full–Color LCD Addressed by Poly–Si TFT's Fabricated Below 450°C".

*Primary Examiner*—Peter Toby Brown
*Assistant Examiner*—Khanh Duong
*Attorney, Agent, or Firm*—Hill & Simpson

[57] ABSTRACT

The manufacturing processes can be simplified and the reliability can be improved. A method of processing a thin film includes a first process of selectively forming a resist pattern on a ground surface, a second process of forming a thin film on the ground surface and a surface of the resist pattern, and a third process of removing the resist pattern to selectively remove the thin film deposited on the former, i.e., carrying out the lift-off, thereby the thin film process for a desired pattern being carried out.

11 Claims, 10 Drawing Sheets

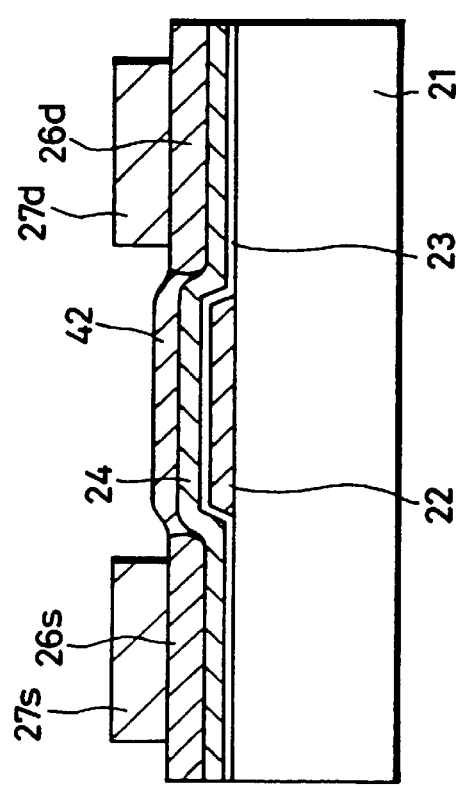
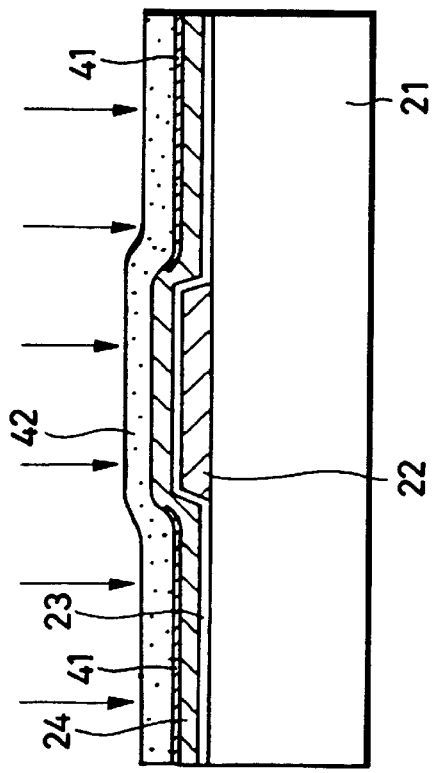
FIG. 10A
FIG. 10B

METHOD OF MANUFACTURING THIN FILM TRANSISTOR

BACKGROUND OF THE INVENTION

1. Field of the Invention

The present invention relates to a method of processing a thin film and a method of manufacturing a thin film semiconductor device and particularly a thin film transistor.

2. Description of the Related Art

FIGS. 1A to 1C are cross-sectional views showing a thin film transistor of a thin film semiconductor device, used to explain manufacturing processes therefor. As shown in FIG. 1A, for example, a gate electrode 2 made of Mo, Ta or the like is deposited on a glass substrate 1 and an oxide film 3 is formed by anodic oxidation so as to cover the gate electrode 2. A ground insulating film 4 made of SiN for shielding impurities or the like from the substrate 1 is formed entirely thereon so as to have a thickness of about 50 nm. A gate insulating film 5 is formed entirely thereon by a process of forming a first $SiO_2$ layer. A first semiconductor layer 6 made of an intrinsic or low impurity concentration amorphous silicon forming a channel forming layer of a thin-film transistor to be finally formed is formed on an entire surface of the gate insulating film 5. The first semiconductor layer 6 is subjected to a first heating process employing laser irradiation (annealing) using an excimer laser irradiation for crystallizing the same, thereby the first semiconductor layer 6 being crystallized. As a result, the first semiconductor layer 6 becomes a polycrystalline semiconductor layer. Then, an $SiO_2$ insulating layer 7, which is to be a stopper of etching to be carried out later on, is formed entirely on the first semiconductor layer 6 by a process of forming a second $SiO_2$ layer.

As shown in FIG. 1B, the $SiO_2$ insulating layer 7 is subjected to a pattern etching employing photolithography in which wet etching employing a fluorine etchant is carried out. The $SiO_2$ insulating layer 7 on a portion of the first semiconductor layer 6 that is finally to be the channel forming portion is left. The $SiO_2$ insulating layer 7 on other portions are removed by etching. Then, a second semiconductor layer 8 formed of an amorphous silicon semiconductor layer heavily doped with n-type or p-type impurity is deposited entirely. The second semiconductor layer 8 is subjected to a second heating processing with laser irradiation employing the excimer laser, for example, thereby the second semiconductor layer 8 being crystallized to make this semiconductor layer polycrystalline. An impurity from the second semiconductor layer 8 is diffused to the first semiconductor layer 6 thereunder with the insulating layer 7 being employed as a mask, and the impurity is activated.

As shown in FIG. 1C, the second semiconductor layer 8 and the first semiconductor layer 6 disposed thereunder are subjected to a pattern etching employing photolithography with the second semiconductor layer 8 which is an upper layer of two semiconductor layers being removed by etching except source-region and drain-region forming portions thereof and with the first semiconductor layer 6 which is a lower layer thereof being removed by etching except a pattern over its source-region and drain-region forming portions and its channel forming portion therebetween.

The pattern etching for the second and first semiconductor layers 8, 6 can be carried out by pattern etching employing the same photolithography. Specifically, etching for separating the source and drain regions of the upper second semiconductor layer 8 is carried out on the insulating layer 7, so that the insulating layer 7 serves as an etching stopper, i.e., an etching mask for the first semiconductor layer 6. Therefore, as shown in FIG. 1C, when the lower first semiconductor layer 6 is etched, the etching is not carried out below the insulating layer 7. As a result, only the source and drain regions of the upper second semiconductor layer 8 are separated. Since the insulating layer 7 is not deposited under the upper second semiconductor layer 8 at outer peripheral portions other than this separated portion, i.e., a portion where the source and drain regions are opposed to each other, the pattern etching of the upper second semiconductor layer 8 and the pattern etching of the lower first semiconductor layer 6 are carried out simultaneously.

In this case, to prevent the etching for separating the source and drain regions of the upper second semiconductor layer 8 from affecting the lower first semiconductor layer 6, this etching for separating the source and drain regions must be reliably carried out on the insulating layer 7. Therefore, an edge portion of the etching for the above separation is located at a position displaced inward from an edge portion of the insulating layer 7 by a predetermined width Ws in consideration of a positioning error, i.e., displacement caused upon the photolithography of the pattern etching, i.e., upon the positioning of an exposure mask relative to a photoresist.

Then, at least the channel forming portion of the first semiconductor layer 6 is subjected to hydrogenation processing for improving characteristics thereof by hydrogen plasma irradiation. Therefore, heat treatment is carried out by laser irradiation, for example, for restoring a damage caused on a semiconductor layer surface by impact or the like of ions generated by plasma upon the hydrogenation processing. In the heat treatment, entire deposition of an SiN film, not shown, prevents hydrogen introduced into the semiconductor layer from being diffused again, and an effect of the hydrogenation is more increased by introducing hydrogen contained in the SiN film into the semiconductor layer.

As described above, source and drain regions $9s$, $9d$ are formed of the first semiconductor layer 6 left after the etching and the second semiconductor layer 8 whose impurity is diffused toward the former.

Source and drain electrodes $10s$, $10d$ are respectively deposited on the source and drain regions $9s$, $9d$ so as to have ohmic contacts. In this case, if the SiN is entirely formed as described above, electrode contact windows are formed therethrough and the source and drain electrodes $10s$, $10d$ are deposited on and brought in contact with the source and drain regions $9s$, $9d$ through the electrode contact windows. Thus, the thin film transistor is manufactured.

Employment of the above method of manufacturing the thin film transistor of the thin film semiconductor device encounters various problems. Specifically, since the insulating layer 7 is deposited on the channel forming portion of the first semiconductor layer 6 according to the above method, the hydrogen introduction to the semiconductor layer 6 is carried out through the insulating layer 7. Moreover, since the semiconductor layer 8 forming the source and drain regions is formed on the insulating layer 7 with being extended inward by the predetermined width Ws, when the hydrogen is introduced into a portion of the semiconductor layer 6 located below the portion of the semiconductor layer 8 extended onto the insulating layer 7 by the predetermined width Ws, the hydrogen is introduced along the surface direction of the insulating layer 7 as schematically shown by arrows a in FIG. 1C. Accordingly, the hydrogenation processing takes a long period of time, which lowers workability.

The above method requires two processes of forming SiO$_2$ films which are the gate insulating film 5 and the insulating layer 7, requires a pattern etching employing photolithography for forming the insulating layer 7 in a predetermined pattern, and requires first and second heating processes employing laser irradiation for the first and second semiconductor layers 6, 8. This requirement complicates the manufacturing process.

Moreover, when the SiO$_2$ layer is etched for forming the insulating layer 7, the fluorine etchant is usually employed. In this etching process, if a glass substrate is employed as the substrate 1, this fluorine etchant also etches the substrates 1 by a thickness corresponding to that of the SiO$_2$ insulating layer 7. Specifically, if the thickness of the insulating layer 7 is 2000Å, for example, the substrate 1 is inevitably etched by 2000Å, which leads to the disadvantage that impurities such as Na, K or the like contained in the substrate, deteriorates and fluctuates characteristics of the transistor. The etching of the substrate contaminates the etchant and decreases lifetime of the etchant.

Since the alignment of the gate electrode 2 and the insulating layer 7, i.e., the alignment of the gate electrode 2 and the channel forming portion of the semiconductor layer 6 is not carried out accurately, an area where the gate electrode 2 is opposed to the source and drain regions is increased beyond necessity, which increases a parasitic capacitance between the gate and the source and drain. As a result, this increase of the parasitic capacitance lowers a switching speed and lowers a frequency characteristic. Moreover, it leads to uneven characteristics of the thin film transistor finally obtained and an increased ratio of manufactured secondary products.

Moreover, with the above method, it is difficult to manufacture a transistor having an offset structure in which the gate electrode is actively located away from the source and drain regions.

SUMMARY OF THE INVENTION

An object of the present invention is to provide a method of processing a thin film and a method of manufacturing a thin film semiconductor device which bring advantages in solving the above problems.

Moreover, according to the present invention, it becomes possible to manufacture the transistor having an offset structure if necessary.

According to the present invention, a method of processing a thin film includes a first process of selectively forming a resist pattern on a ground surface, a second process of forming a thin film on the ground surface and a surface of the resist pattern, and a third process of removing the resist pattern to selectively remove the thin film deposited on the resist pattern, i.e., carrying out a lift-off, thereby a thin film process for a desired pattern being carried out.

According to the present invention, a method of manufacturing a thin film semiconductor device includes a process of forming a gate electrode on a substrate, a process of forming a gate insulating film on the gate electrode, a process of forming a resist pattern corresponding to the gate electrode, a process of entirely depositing an impurity containing layer, and a process of removing the resist pattern and then selectively removing the impurity containing layer deposited thereon, i.e., carrying out the lift-off to form a source region and a drain region, thereby the thin film semiconductor device being obtained.

When the above method according to the present invention is employed, it is possible to reliably form the thin film in a pattern with a simple method, and, upon fabrication of a thin film transistor of the thin film semiconductor device, it is possible to mass-produce the transistors having excellent characteristics and high reliability.

BRIEF DESCRIPTION OF THE DRAWINGS

FIGS. 10A and 10B are cross-sectional views showing the thin film semiconductor device, used to explain the method of manufacturing the same according to the fifth embodiment of the present invention.

DESCRIPTION OF THE PREFERRED EMBODIMENTS

Embodiments according to the present invention will be described.

According to the present invention, a method of processing a thin film fundamentally includes a first process of selectively forming a resist pattern on a ground surface, a second process of forming a thin film on the ground surface and a surface of the resist pattern, and a third process of removing the resist pattern to selectively remove the thin film deposited on the former, i.e., carrying out a lift-off, thereby a thin film process for a desired pattern being carried out.

Embodiments of a method of forming an offset type thin film transistor by the method according to the present invention will hereinafter be described mainly.

First Embodiment

FIGS. 2A to 2D and 3A and 3B are diagrams showing processes in the first embodiment.

In this case, a substrate 21 is prepared initially. The substrate 21 is formed of a transparent substrate, such as a glass substrate, a quartz substrate, a plastic substrate or the like, having a light transmission relative to exposure light for a photoresist described later on.

Figure 2A:
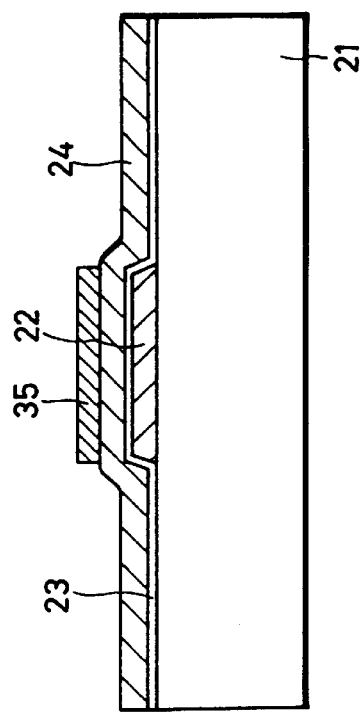
FIGS. 2A to 2D are cross-sectional views showing a thin film semiconductor device, used to explain a method of manufacturing the same according to a first embodiment of the present invention.

As shown in FIG. 2A, a gate electrode 22 is deposited on the substrate 21. When the gate electrode 22 is formed, a metal such as Al, Mo, Ti or the like is entirely formed by sputtering, evaporation layer or the like and subjected to a pattern etching employing photolithography, thereby being formed in a predetermined pattern. Though not shown, a surface of the gate electrode 22 is subjected to anodic oxidation if necessary.

An insulative ground layer 23 made of SiN for shielding impurities or the like from the substrate 21 is entirely formed so as to have a thickness of about 50 nm, for example. An $SiO_2$ gate insulating film 24 is deposited on the ground layer 23. A positive photoresist, i.e., a photoresist 25 formed of an organic material, e.g., microposit S1808 (a tradename of a product manufactured by Shipley Co. Ltd.) whose exposed portion is removed by development is coated on an entire surface of the gate insulating film 24 employed as a ground surface.

As schematically shown by arrows in FIG. 2A, the photoresist 25 is exposed to light from a rear side surface of the substrate 21 with the gate electrode 22 being employed as an exposure mask, and then a development processing is carried out.

Figure 2B:
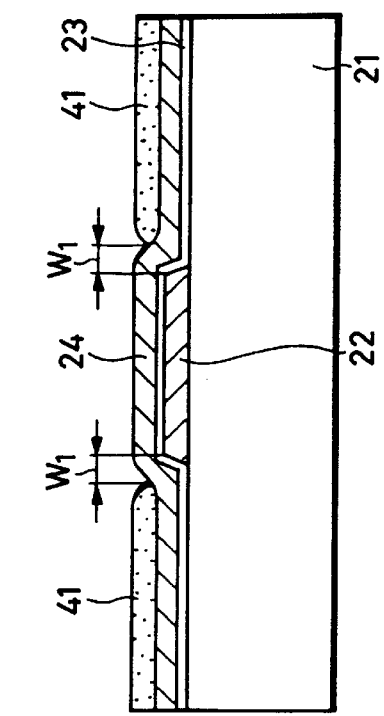
Figure 2C:
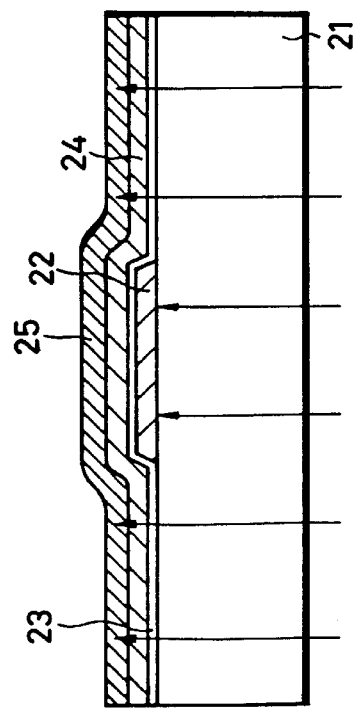

As shown in FIG. 2B, this processing permits the formation of a resist pattern 35 having a pattern aligned with and corresponding to the pattern of the gate electrode 22, i.e., a resist pattern for lift-off which will be described later on. Thereafter, the resist pattern 35 is softened or melted by heat treatment at 140° C., for example. As a result, the resist pattern 35 is fluidly extended on the gate insulating film 24 as shown in FIG. 2C, and extended over a predetermined width $W_0$ from edge portions of the gate electrode 22. The width $W_0$ can be selected by controlling a thickness of the resist pattern 35, its exposure time, a heating temperature therefor and so on. The width $W_0$ can be set to about 1 $\mu$m or greater, for example.

Then, a thin film to be formed in a desired pattern, e.g., in this embodiment, an impurity containing layer 41 formed of an amorphous silicon semiconductor layer heavily doped with an n-type or p-type impurity is entirely formed so as to have a thickness of 30 nm, for example. In this case, it is by a plasma enhanced chemical vapor deposition (PECVD) at 90° C., e.g., below a heat-resistance temperature of the resist pattern 35 (in general, 150° C. or lower) that the impurity containing layer 41 is formed.

Figure 2D:
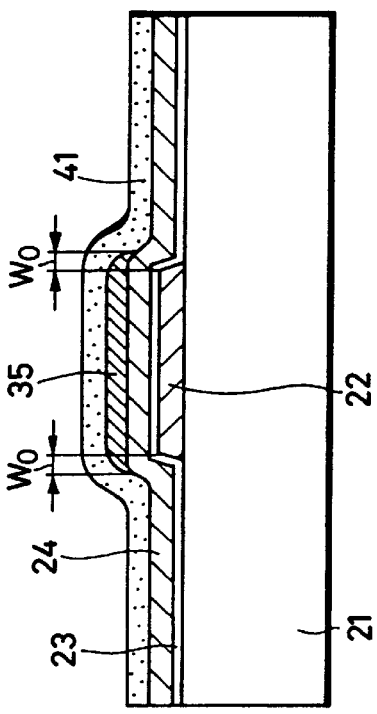

Thus, as shown in FIG. 2D, the resist pattern 35 is removed. Simultaneously, the impurity containing layer 41 deposited on the resist pattern 35 is removed selectively, i.e., lifted off. It is by, for example, wet process, e.g., applying super ultrasonic vibration to the semiconductor device in acetone that the resist pattern 35 is removed.

As shown in FIG. 2D, this wet process permits the impurity containing layers 41 to be separated and left at positions across the gate electrode 22 each of which has an offset width $W_1$ satisfying $W_1 > W_0$, for example, and corresponding to the above offset width $W_0$ and each of which is displaced outward from each of the channel-width direction ends of the gate electrode 22 by $W_1$, for example.

Figure 3B:
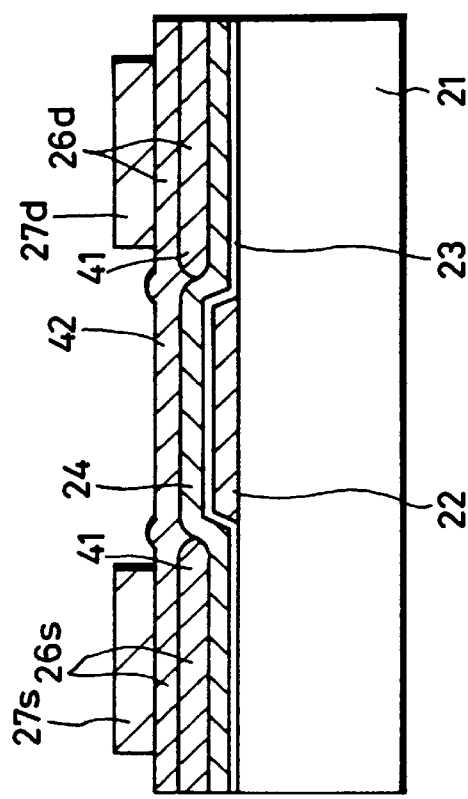
FIGS. 3A and 3B are cross-sectional views showing the thin film semiconductor device, used to explain the method of manufacturing the same according to the first embodiment of the present invention.
Figure 3A:
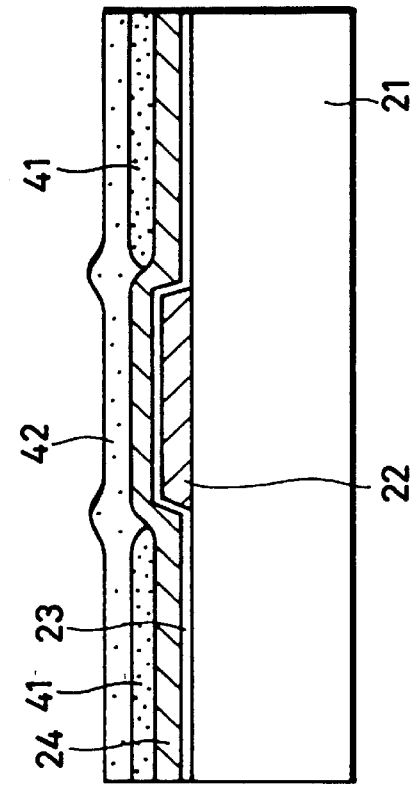

Thus, as shown in FIG. 3A, an intrinsic or low-concentration semiconductor 42 made of an amorphous silicon semiconductor layer having a sufficiently low impurity concentration as compared with that of the impurity containing layer 41 is entirely formed by the PECVD, for example.

Then, heat treatment for the impurity containing layer 41 and the intrinsic or low-concentration semiconductor layer 42 both of which are formed of the amorphous semiconductor layers is simultaneously carried out in the same heat treatment process by irradiating rays of excimer laser light, for example, thereon, thereby the impurity containing layer 41 and the intrinsic or low-concentration semiconductor layer 42 being crystallized to be polycrystalline semiconductor layers. At this time, the heat treatment diffuses impurities in the impurity containing layer 41 into the intrinsic or low-concentration semiconductor layer 42 formed on the impurity containing layer 41 in contact therewith, and activates the impurities. Thus, as shown in FIG. 3B, source and drain regions 26s and 26d are formed.

In this case, it is considered that heat applied by the laser light irradiation melts the silicon (Si) semiconductor layer to diffuse the impurity and consequently the impurity is diffused to a portion where an offset portion is to be formed. However, since a melting time of Si after the laser irradiation is about 100 ns while it is known that a diffusion coefficient D of P (phosphorus) in the molten Si is $5.1 \times 10^{-4}$ [$cm^2$ $sec^{-1}$], a diffusion length at one laser irradiation is about 30 nm according to an equation of diffusion length $L=\sqrt{(DT)}$ where a melting time is T. Therefore, it is possible to sufficiently keep an offset amount.

Then, the semiconductor layer 42 exposed to the outside is subjected to hydrogenation processing, e.g., hydrogen introduction processing by hydrogen plasma irradiation. Then, heat treatment is applied to the semiconductor layer 42 to recover crystals of the semiconductor layer 42 damaged by the plasma irradiation. When SiN, though not shown, is deposited on a surface of the semiconductor layer 42 in this treatment, as described above, hydrogen can be prevented from being diffused again and introduction of hydrogen from the SiN reliably improves and stabilizes characteristics of the semiconductor layer 42.

As described above, it is possible to obtain the desired thin film transistor in which, as shown in FIG. 3B, a channel forming portion is formed in the intrinsic or low-concentration semiconductor layer 42 formed on the gate electrode 22 through the gate insulating layer 24 and the source and drain regions 26s, 26d are formed at both sides thereof. If a covering layer made of SiN or the like is formed on the source and drain regions 26s, 26d, then electrode contact windows are formed through the covering layer and respective source and drain electrodes 27s, 27d are deposited on the source and drain regions 26s, 26d therethrough so as to have ohmic contacts therewith. These electrodes 27s, 27d can be formed simultaneously by entire evaporation of metal and a succeeding pattern etching employing photolithography. Thus, the desired thin film transistor is formed.

Figure 4:
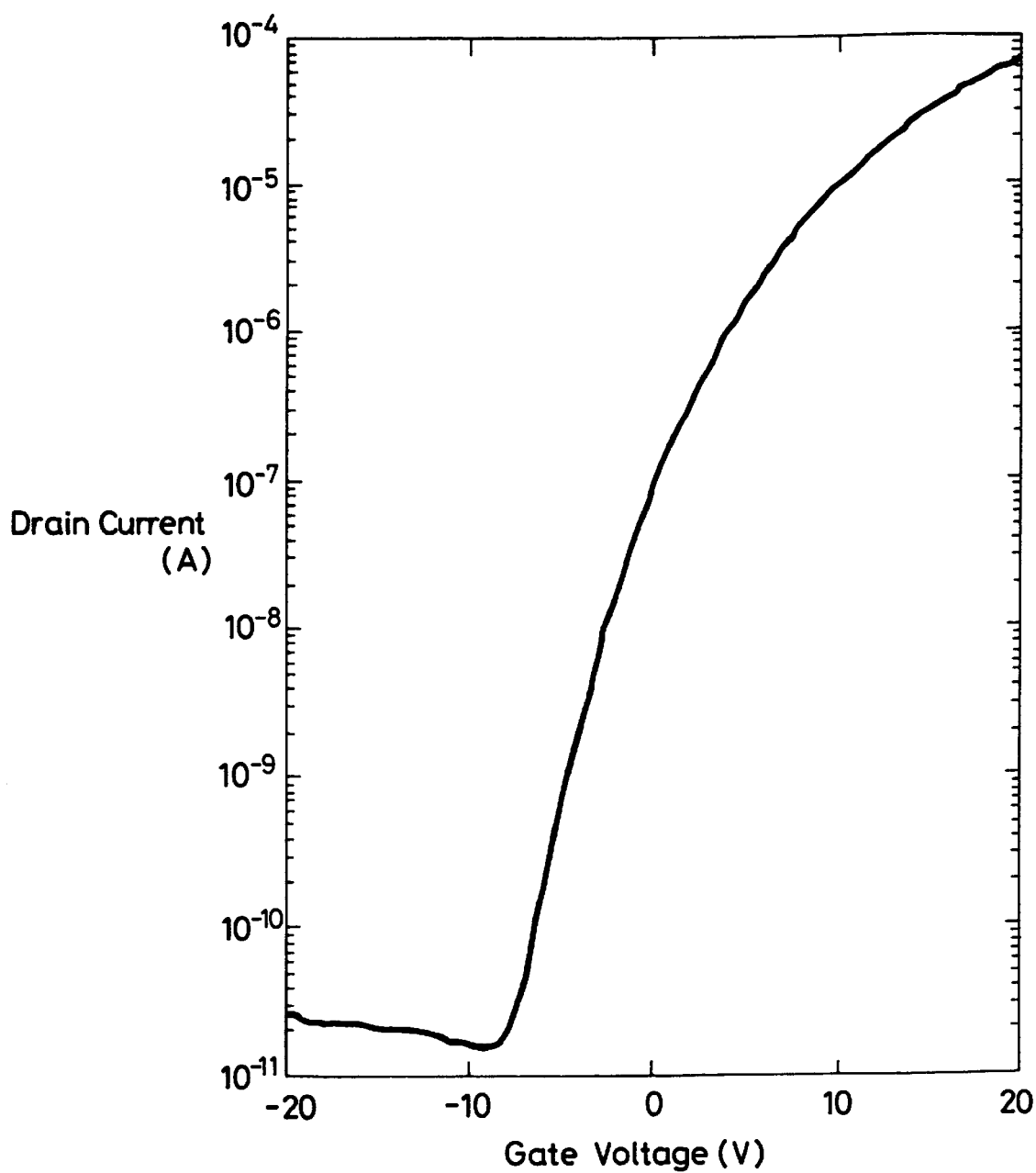
FIG. 4 is a graph showing a characteristic curve of a thin film transistor obtained by the method according to the present invention.

FIG. 4 is a graph showing a drain current-gate voltage characteristic of the thin film transistor obtained by the method according to the present invention. Study of this graph reveals that the transistor (field effect transistor) obtained by the method according to the present invention provides excellent characteristics. While in this embodiment the annealing is carried out upon the hydrogenation processing without the source and drain regions 26s, 26d being covered with SiN, the annealing carried out after the source and drain regions 26s, 26d being covered with SiN provides excellent characteristics showing a sharper rise in the graph.

In the above embodiment, the impurity containing layer 41 formed of an impurity-doped semiconductor layer is initially formed, the patterning thereof, i.e., separate formation of the source and the drain is carried out by the lift-off of the resist pattern 35, and thereafter the intrinsic or low-concentration semiconductor layer 42 is formed. Conversely, it is possible that after the intrinsic or low-concentration semiconductor layer 42 is formed, the resist pattern 35 and the first impurity containing layer 41 are successively formed, and the lift-off for separating the source and the drain regions is carried out.

An embodiment of this arrangement will be described.

Second Embodiment

FIGS. 5A to 5D are diagrams showing processes of this embodiment.

Figure 5A:
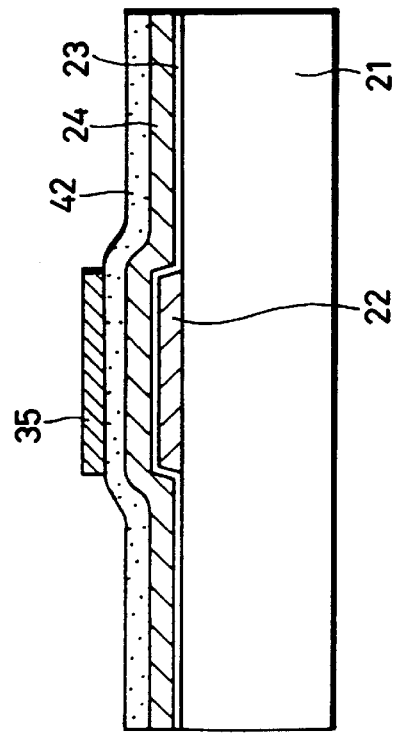
FIGS. 5A to 5D are cross-sectional views showing a thin film semiconductor device, used to explain a method of manufacturing the same according to a second embodiment of the present invention.

As shown in FIG. 5A, a substrate 21 is initially prepared also in this embodiment. The substrate 21 is formed of a transparent substrate, such as a glass substrate, a quartz substrate, a plastic substrate or the like, having light transmission relative to exposure light for a photoresist which is used later on similarly to the first embodiment.

A gate electrode 22 is formed on the substrate 21 similarly to the above method of the first embodiment. An insulating layer is formed on a surface of the gate electrode 22 by anodic oxidation if necessary. An insulative ground layer 23 made of SiN, with a thickness of about 50 nm, for example, for shielding impurities or the like from the substrate 21 is entirely formed with covering the gate electrode 22. An $SiO_2$ gate insulating film 24 is deposited on the ground layer 23. In the second embodiment, an intrinsic or low-concentration semiconductor layer 42 made of amorphous Si similar to that described in the first embodiment is formed on the entire surface of the gate insulating film 24, and a positive photoresist 25 similar to that of the first embodiment is coated on the entire surface of the semiconductor layer 42.

As schematically shown by arrows in FIG. 5A, the photoresist 25 is exposed to light from a rear side surface of the substrate 21 with the gate electrode 22 being employed as an exposure mask, and then a development processing is carried out.

Figure 5B:
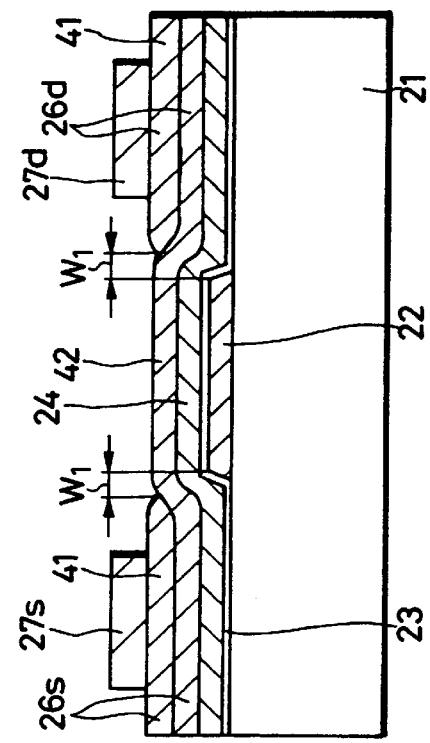

Thus, as shown in FIG. 5B, this process permits a resist pattern 35 having a pattern aligned with and corresponding to the pattern of the gate electrode 22 to be formed over the gate electrode 22.

Figure 5C:
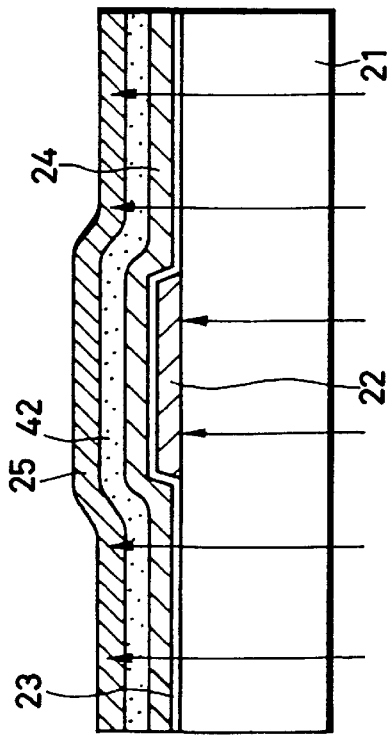

As shown in FIG. 5C, the resist pattern 35 is heated, and is fluidly extended by a predetermined width $W_0$ from edge portions of the gate electrode 22, similarly to the above embodiment. The width $W_0$ can be selected by controlling a thickness of the resist pattern 35, its exposure time, a heating temperature thereof and so on as described above. The width $W_0$ can be set to about $1\mu m$ or greater, for example. Thus, a mask for the lift-off described later on is formed.

Then, in this embodiment, an impurity containing layer 41 formed of, for example, an amorphous silicon semiconductor layer heavily doped with an n-type or p-type impurity is formed entirely, i.e., on a surface of the resist pattern 35 and a surface of the semiconductor layer 42 which is exposed to the outside because the resist pattern 35 is not formed thereon, so as to have a thickness of 30 nm, for example. In this case, it is by the PECVD at 90° C., e.g., below a heat-resistance temperature of the resist pattern 35 (in general, 150° C. or lower) that the impurity containing semiconductor 41 is formed.

Figure 5D:
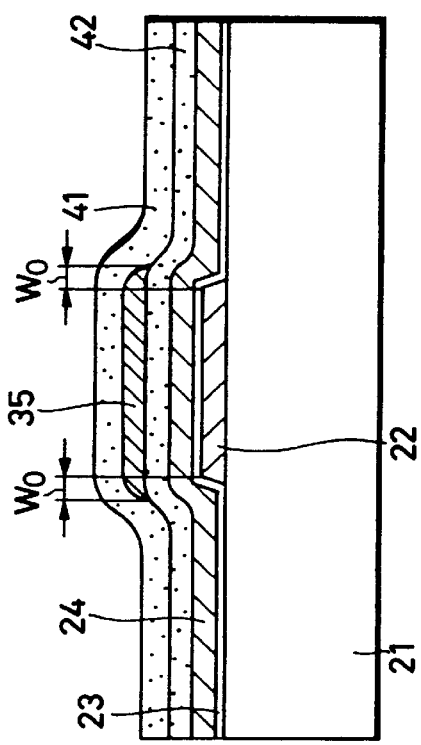

As shown in FIG. 5D, the resist pattern 35 is removed by wet process of applying ultrasonic vibration to the semiconductor device in acetone, for example, similarly to the first embodiment, thereby the impurity containing layer 41 deposited on the resist pattern 35 being selectively removed, i.e., lifted off.

This arrangement permits a pair of the impurity containing layers 41 to be separated and left at positions across the gate electrode 22 each of which is displaced away from each of the channel-width direction ends of the gate electrode 22 only by an offset width $W_1$ corresponding to the above offset width $w_0$.

Then, heat treatment for the impurity containing layer 41 and the intrinsic or low-concentration semiconductor layer 42 both of which are made of amorphous Si is simultaneously carried out in the same heat treatment process for crystallization by irradiating excimer laser beams, for example, thereon, thereby the impurity containing layer 41 and the semiconductor layer 42 being crystallized to be polycrystalline semiconductor layers. At this time, impurities in the impurity containing layer 41 are diffused into the semiconductor layer 42 under the impurity containing layer 41, and the impurities are activated. As shown in FIG. 5D, source and drain regions 26s and 26d are formed.

Then, the semiconductor layer 42 exposed to the outside is subjected to hydrogen introduction processing by hydrogen plasma irradiation. Then, heat treatment is applied to the semiconductor layer 42 to recover crystals of the semiconductor layer 42 damaged by the plasma irradiation. When SiN, though not shown, is deposited on a surface of the semiconductor layer 42 in this treatment as described above, it is possible to prevent hydrogen from being diffused again and to introduce hydrogen more reliably.

As described above, it is possible to obtain the desired thin film transistor in which a channel forming portion is formed in the second intrinsic or low-concentration semiconductor layer 42 formed on the gate electrode 22 through the gate insulating layer 24 and the source and drain regions 26s, 26d are formed at both sides of thereof. If a covering layer made of SiN or the like is formed on the source and drain regions 26s, 26d, then electrode contact windows are formed through the covering layer, and respective source and drain electrodes 27s, 27d are deposited on the source and drain regions 26s, 26d therethrough so as to have ohmic contacts. These electrodes 27s, 27d can be formed simultaneously by entire evaporation of metal and a succeeding pattern etching employing photolithography. Thus, the desired thin film transistor is arranged.

In each of the first and second embodiments, when the resist pattern 35 is formed and the thin film is formed thereon, the resist pattern 35 is removed, thereby the thin film formed on the resist pattern 35 being subjected to the lift-off by the wet process. However, such wet process inevitably involves problems of handling a treatment solution and of unsatisfactory controllability resulting from fatigue of the treatment solution, and comparatively complicated processes of washing or the like thereafter, and moreover involves deterioration of the substrate 21 when a plastic substrate or the like is employed as the substrate 21.

Such complicated work and disadvantage can be avoided when elimination, i.e., lift-off of the resist pattern 35 is carried out by a dry process. In the dry process, the resist pattern 35 is removed by irradiation of an energy beam, e.g., irradiation of an excimer laser beam.

An embodiment for carrying out the lift-off by the dry process will subsequently be described.

Third Embodiment

In this embodiment, an operation of removing the resist pattern 35 in the first embodiment is carried out by the dry process.

Figure 6A:
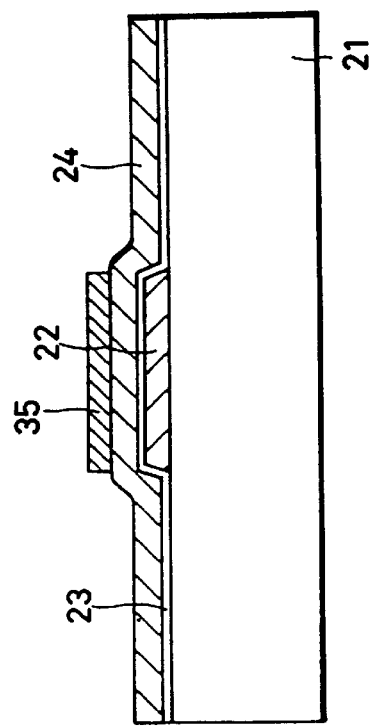
FIGS. 6A to 6D are cross-sectional views showing a thin film semiconductor device, used to explain a method of manufacturing the same according to a third embodiment of the present invention.

In this embodiment, the same processes as described with reference to FIGS. 2A, 2B are employed. Specifically, as shown in FIG. 6A, a substrate 21 formed of a transparent substrate, such as a glass substrate, a quartz substrate, a plastic substrate or the like, having light transmittance relative to exposure light for a photoresist described later on is prepared initially. On this substrate 21, a gate electrode 22 formed of a metal layer made of Al, Mo, Ti or the like is deposited. Though not shown, a surface of the gate electrode 22 is subjected to anodic oxidation if necessary.

An insulative ground layer 23 made of SiN for shielding impurities or the like from the substrate 21 is entirely formed thereon so as to have a thickness of about 50 nm, for example. An $SiO_2$ gate insulating film 24 is deposited on the ground layer 23. A positive photoresist 25 similar to that employed in the first embodiment is coated on an entire surface of the gate insulating film 24 as a ground surface.

Then, as schematically shown by arrows in FIG. 6A, the photoresist 25 is exposed to light from the rear surface side of the substrate 21 with the gate electrode 22 being employed as an exposure mask, and then development is carried out.

Figure 6C:
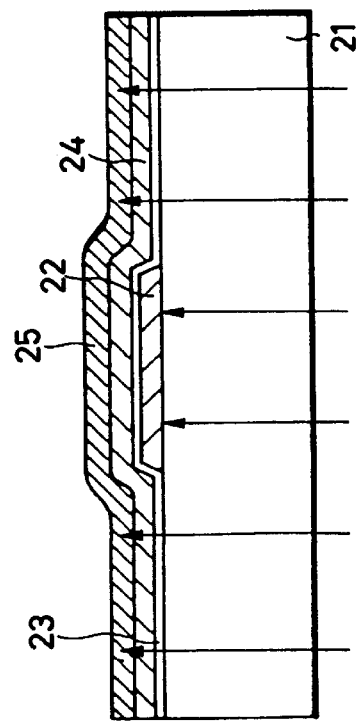
Figure 6B:
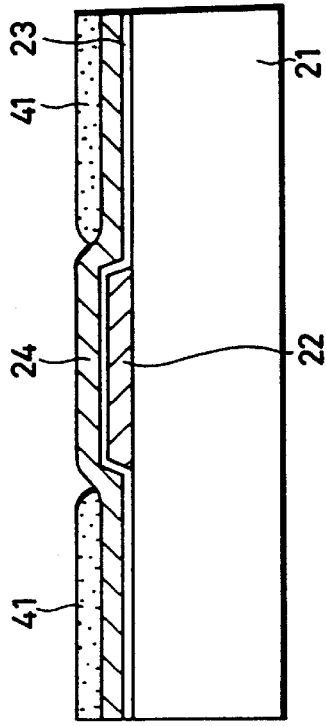
Figure 6D:
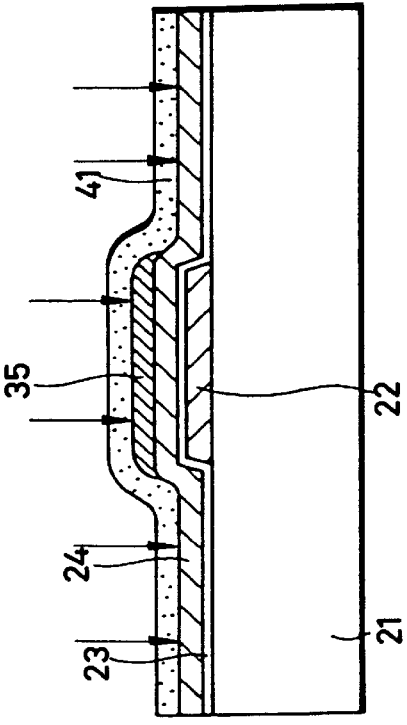

Thus, as shown in FIG. 6B, a resist pattern 35 corresponding to the pattern of the gate electrode 22, i.e., the resist pattern 35 for the lift-off described later on is formed on the gate electrode 22 with being aligned with the gate electrode 22.

Then, the same heat treatment similar to that employed in the first embodiment is carried out, and as shown in FIG. 6C, the resist pattern 35 is fluidly extended over the gate insulating film 24. Then, a thin film to be formed in a desired pattern, e.g., an impurity containing layer 41 formed of an amorphous silicon semiconductor layer heavily doped with an n-type or p-type impurity in this embodiment is entirely formed thereon by the PECVD or the like so as to have a thickness of 30 nm, for example.

In this embodiment, subsequently the resist pattern 35 is removed by the dry process, and the impurity containing layer 41 deposited on the resist pattern 35 is selectively removed together with the resist pattern 35. Specifically, the lift-off is carried out. As schematically shown by arrows in FIG. 6C, the resist pattern 35 is removed by irradiating an energy beam, an excimer laser beam having a wavelength of 308 nm in this embodiment, thereon particularly from the side of the impurity containing layer 41 made of amorphous Si. When pulsed excimer laser beams are irradiated about four times, the resist pattern 35 made of an organic material disappears and, together with the disappearance, the impurity containing layer 41 formed of an amorphous silicon semiconductor layer deposited on the resist pattern 35 is selectively removed, i.e., lifted off. This disappearance of the resist pattern 35 and the resultant selective removal of the impurity containing layer 41 seem to be caused since the impurity containing layer 41 made of amorphous Si partially absorbs and transmits the excimer laser beam to thereby heat the impurity containing layer 41 and the resist pattern 35 and hence ablation in which molecular or atomic bond is cut occurs. Observation of the semiconductor device reveals that a pattern formed by such selective removal with the lift off becomes a pattern having a clear edge portion with a smooth curve and straight line and excellent sharpness.

Then, the impurity containing layers 41 are separated and left at positions located across the gate electrode 22 at both of the edge porions of the gate electrode 22 in the longitudinal direction.

It is desirable to, after this patterning processing, clean the thin film formed in the pattern, i.e., the surface of the impurity containing layer 41 and the ground surface, i.e., the surface of the gate insulating layer 24 exposed by removal of the resist pattern 35. This cleaning can be carried out by irradiating ultraviolet (UV) rays in an ozone atmosphere.

Figure 7A:
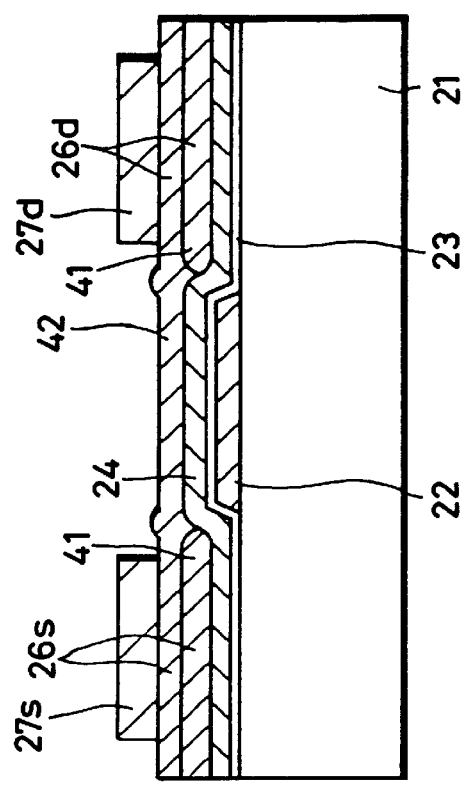
FIGS. 7A and 7B are cross-sectional views showing the thin film semiconductor device, used to explain the method of manufacturing the same according to the third embodiment of the present invention.

Then, similarly to the first embodiment, as shown in FIG. 7A, an intrinsic or low-concentration semiconductor layer 42 formed of an amorphous silicon semiconductor layer having sufficiently low impurity concentration as compared with the impurity containing layer 41 is entirely formed thereon by the PECVD, for example.

Figure 7B:
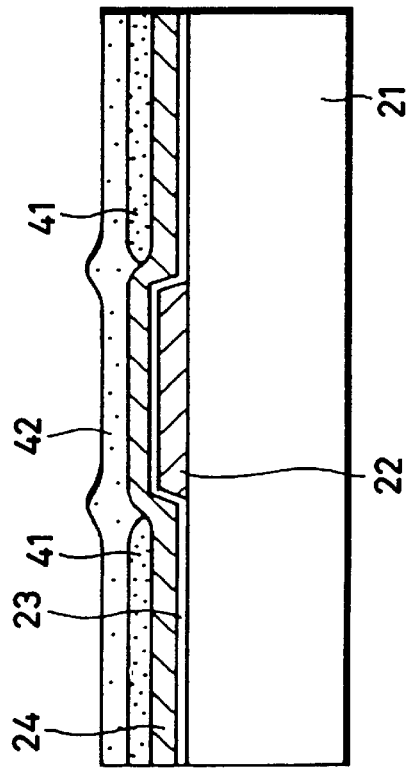

Then, heat treatment for the impurity containing layer 41 and the intrinsic or low-concentration semiconductor layer 42 both of which are formed of the amorphous semiconductor layers is simultaneously carried out in the same heat treatment process by irradiating rays of excimer laser light, for example, thereon, thereby the impurity containing layer 41 and the intrinsic or low-concentration semiconductor layer 42 being crystallized to be polycrystalline semiconductor layers. At this time, the heat treatment diffuses the impurities in the impurity containing layer 41 into the intrinsic or low-concentration semiconductor layer 42 formed on the impurity containing layer 41 in contact therewith, and activates the impurities. As shown in FIG. 7B, source and drain regions 26s and 26d are formed.

Then, the semiconductor layer 42 exposed to the outside is subjected to hydrogenation processing, e.g., hydrogen introduction processing by hydrogen plasma irradiation. Then, heat treatment is subjected to the semiconductor layer 42 to recover crystals of the semiconductor layer 42 damaged by the plasma irradiation. When SiN, though not shown, is deposited on a surface of the semiconductor layer 42 in this treatment, as described above, hydrogen can be prevented from being diffused again and introduction of hydrogen from the SiN reliably improves and stabilizes characteristics of the semiconductor layer 42.

As described above, it is possible to obtain the desired thin film transistor in which, as shown in FIG. 7B, a channel forming portion is formed in the intrinsic or low-concentration semiconductor layer 42 formed on the gate electrode 22 through the gate insulating layer 24 and the source and drain regions 26s, 26d are formed at both sides of thereof. When a covering layer made of SiN or the like is formed on the source and drain regions 26s, 26d, electrode contact windows are formed through the covering layer and the respective source and drain electrodes 27s, 27d are deposited on the source and drain regions 26s, 26d therethrough so as to have ohmic contacts. These electrodes 27s, 27d can be formed simultaneously by entire evaporation of metal and a succeeding pattern etching employing photolithography. Thus, the desired thin film transistor is formed.

Fourth Embodiment

In this embodiment, the removal of the resist pattern 35 in the second embodiment is carried out by the dry process.

Figure 8A:
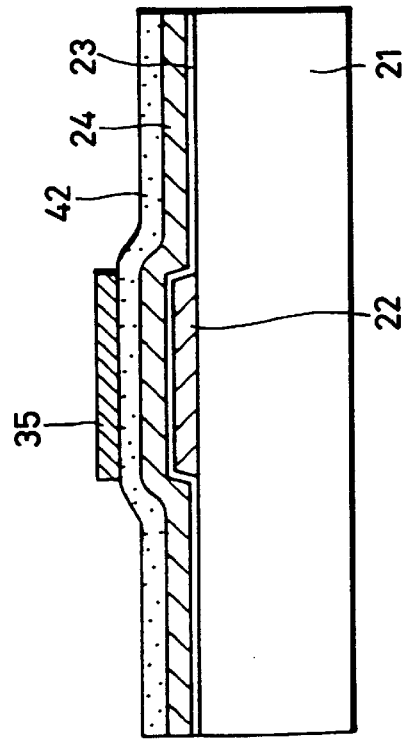
FIGS. 8A to 8D are cross-sectional views showing a thin film semiconductor device, used to explain a method of manufacturing the same according to a fourth embodiment of the present invention.

In this embodiment, as shown in FIG. 8A, similarly to the embodiment described with reference to FIG. 5A, a substrate 21 formed of a transparent substrate, such as a glass substrate, a quartz substrate, a plastic substrate or the like, having light transmittance relative to exposure light to be emitted to a photoresist later on is prepared initially. A gate electrode 22 is formed on this substrate 21, and an insulating layer is formed on a surface thereof by anodic oxidation, for example, if necessary. An insulative ground layer 23 made of SiN having a thickness of about 50 nm, for example, for shielding impurities or the like from the substrate 21 is entirely formed thereon so as to cover the gate electrode 22. An $SiO_2$ gate insulating film 24 is deposited on the ground layer 23.

In this embodiment, similarly to the second embodiment, an intrinsic or low-concentration semiconductor layer 42 made of amorphous Si similar to that described above is formed on an entire surface of the gate insulating layer 24. A positive photoresist 25 similar to that described above is coated on an entire surface of the semiconductor layer 42.

Then, as schematically shown by arrows in FIG. 8A, the photoresist 25 is exposed to light from the rear surface side of the substrate 21 with the gate electrode 22 being employed as an exposure mask, and then development is carried out.

Figure 8B:
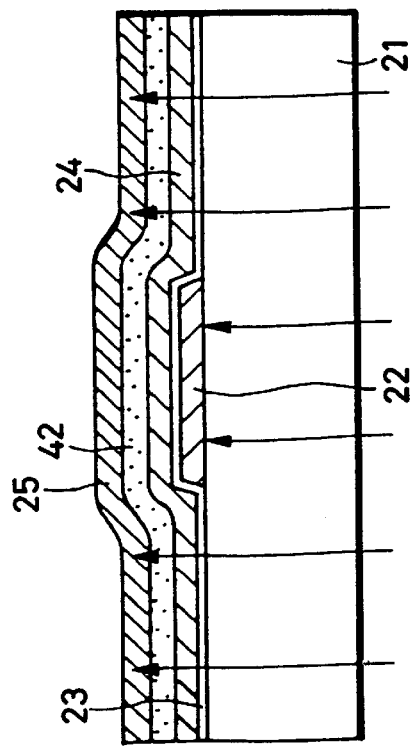

Thus, as shown in FIG. 8B, a resist pattern 35 corresponding to the pattern of the gate electrode 22 is formed on the gate electrode 22 which being aligned with the gate electrode 22.

Figure 8C:
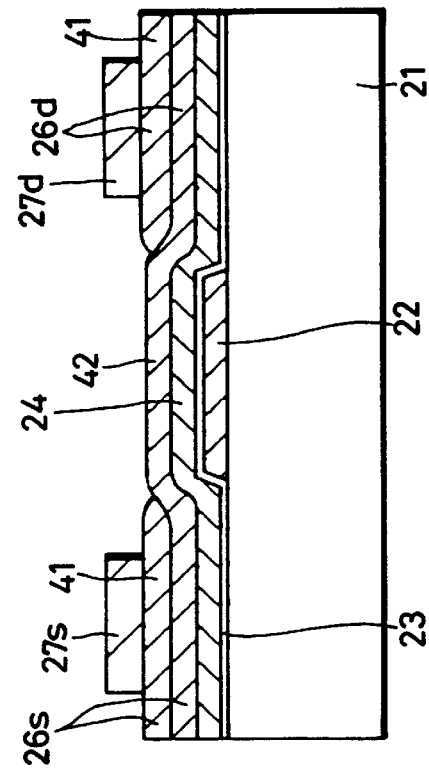

As shown in FIG. 8C, the resist pattern 35 is heated, and is fluidly extended only by a predetermined width from edge portions of the gate electrode 22, similarly to the above embodiment.

Then, a thin film, i.e., an impurity containing layer 41 formed of an amorphous silicon semiconductor layer heavily doped with an n-type or p-type impurity in this embodiment is formed by the method similar to that employed in the second embodiment entirely, i.e., over the surface of the resist pattern 35 and the surface of the second semiconductor layer 42 which is exposed to the outside since the resist pattern 35 is not formed there.

Figure 8D:
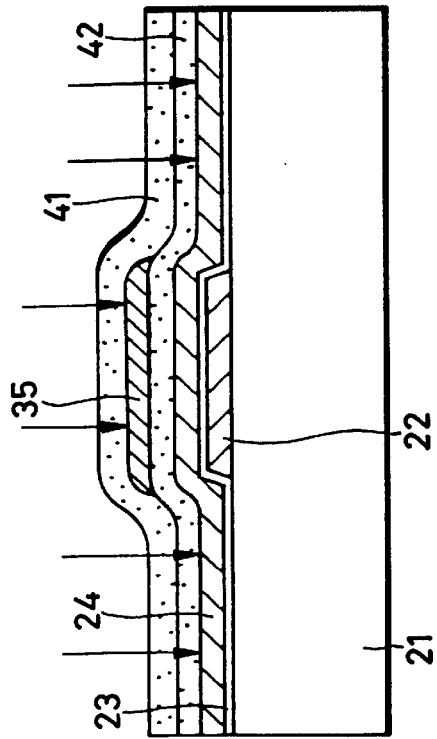

In the fourth embodiment, subsequently the resist pattern 35 is removed by the dry process, and the impurity containing layer 41 deposited on the resist pattern 35 is selectively removed together with the resist pattern 35. Specifically, the lift-off is carried out. As schematically shown by arrows in FIG. 8C, the resist pattern 35 is removed by irradiating an energy beam, an excimer laser beam having a wavelength of 308 nm in this embodiment, thereon particularly from the side of the impurity containing layer 41 made of amorphous Si. When pulsed excimer laser beams are irradiated about four times, the resist pattern 35 made of an organic material disappears similarly to the third embodiment and, as a result of the disappearance, the impurity containing layer 41 formed of an amorphous silicon semiconductor layer on the resist pattern 35 is selectively removed, i.e., lifted off as shown in FIG. 8D.

As described above, a pair of the impurity containing layers 41 are separated and left at positions across the gate electrode 22 offset from the respective edge portions of the gate electrode 22 in the longitudinal direction.

Then, heat treatment for the impurity containing layer 41 and the intrinsic or low-concentration semiconductor layer 42 both of which are formed of the amorphous Si is simultaneously carried out in the same process, e.g., in the same crystallizing process of heating both of the layers 41, 42 by irradiating rays of excimer laser light, for example, thereon, thereby the impurity containing layer 41 and the intrinsic or low-concentration semiconductor layer 42 being made polycrystalline semiconductor layers. At this time, impurities in the impurity containing layer 41 are diffused into the intrinsic or low-concentration semiconductor layer 42 formed under the impurity containing layer 41, and the impurities are activated. As shown in FIG. 8D, source and drain regions 26s and 26d are formed.

Then, the semiconductor layers 41, 42 exposed to the outside are subjected to hydrogen introduction processing by hydrogen plasma irradiation. Then, heat treatment is applied to the semiconductor layers 41, 42 to recover crystals of the semiconductor layers damaged by the plasma irradiation. When SiN, though not shown, is deposited on a surface of the semiconductor layer in this treatment, as described above, hydrogen can be prevented from being diffused again and introduction of hydrogen from the SiN reliably improves and stabilizes characteristics of the semiconductor layer.

As described above, it is possible to obtain the desired thin film transistor in which a channel forming portion is formed in the second intrinsic or low-concentration semiconductor layer 42 formed on the gate electrode 22 through the gate insulating layer 24 and the source and drain regions 26s, 26d are formed at both sides of thereof. If a covering layer made of SiN or the like is formed on the source and drain regions 26s, 26d, then electrode contact windows are formed through the covering layer and the respective source and drain electrodes 27s, 27d are deposited on the source and drain regions 26s, 26d therethrough so as to have ohmic contacts. These electrodes 27s, 27d can be formed simultaneously by entire evaporation of metal and a succeeding pattern etching employing photolithography. Thus, the desired thin film transistor is formed.

As described above, when the resist pattern is removed, i.e., lifted off, by the dry process, solution for the treatment as used in the wet process is not required. Therefore, it is possible to simplify the work and to provide satisfactory controllability.

While in each of the above first to fourth embodiments the impurity containing layer 41 is a semiconductor layer, the impurity containing layer 41 may be formed of an impurity containing layer formed of a thin film doped with impurities, for example, through the resist pattern 35 by plasma doping or the like. Subsequently, an embodiment therefor will be described.

Fifth Embodiment

FIGS. 9A to 9D and 10A and 10B are diagrams showing processes of this embodiment.

Figure 9A:
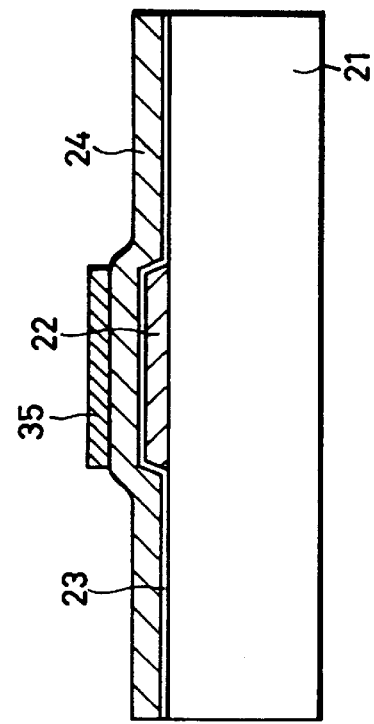
FIGS. 9A to 9D are cross-sectional views showing a thin film semiconductor device, used to explain a method of manufacturing the same according to a fifth embodiment of the present invention.

In this embodiment, the same processes described in the first embodiment with reference to FIGS. 2A and 2B are employed. Specifically, as shown in FIG. 9A, a substrate 21 formed of a transparent substrate, such as a glass substrate, a quartz substrate, a plastic substrate or the like, having light transmittance relative to exposure light for a photoresist described later on is prepared initially. On this substrate 21, a gate electrode 22 formed of a metal layer made of Al, Mo, Ti or the like is deposited. Though not shown, a surface of the gate electrode 22 is subjected to anodic oxidation if necessary.

A ground layer 23 made of SiN for shielding impurities or the like from the substrate 21 is entirely formed thereon so as to have a thickness of about 50 nm, for example. An $SiO_2$ gate insulating film 24 is deposited on the ground layer 23. A positive photoresist 25 similar to that employed in the first embodiment is coated on an entire surface of the gate insulating film 24 as a ground surface.

Then, as schematically shown by arrows in FIG. 9A, the photoresist 25 is exposed to light from the rear surface side of the substrate 21 with the gate electrode 22 being employed as an exposure mask, and then development is carried out.

Figure 9B:
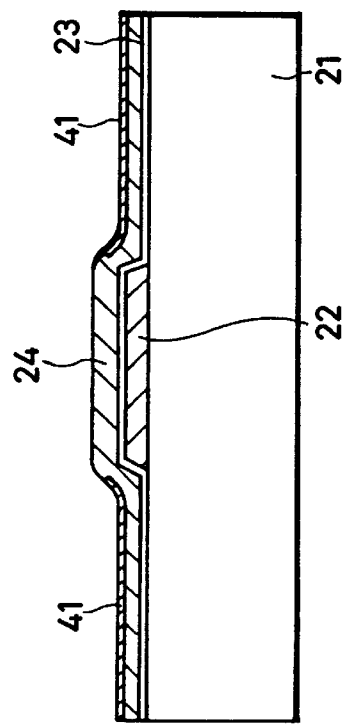

Thus, as shown in FIG. 9B, a resist pattern 35 corresponding to the pattern of the gate electrode 22, i.e., a resist pattern 35 for the lift-off described later on is formed on the gate electrode 22 with being aligned with the gate electrode 22.

Figure 9C:
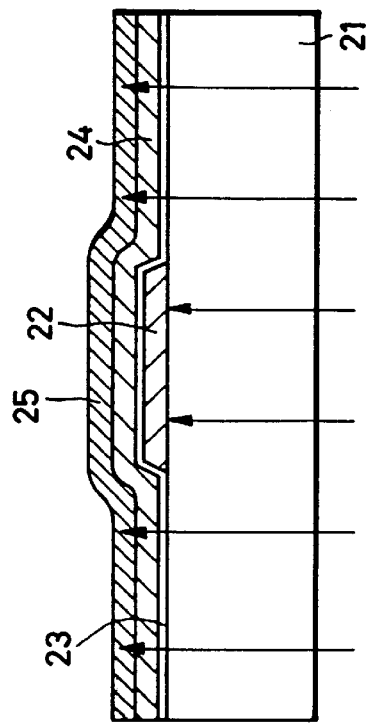

Then, the same heat treatment similar to that employed in the first embodiment is carried out. As shown in FIG. 9C, the resist pattern 35 is fluidly extended over the gate insulating film 24. Then, an impurity containing layer 41 is formed. In this embodiment, the impurity containing layer 41 is formed by subjecting the resist pattern 35 and the ground surface exposed to the outside, i.e., an entire surface of the gate insulating film 24 in this embodiment to a p-type or n-type impurity doping. This impurity doping is achieved by plasma doping employing an n-type impurity source $PH_3$.

Subsequently, the resist pattern 35 is removed by the dry or wet process, and the impurity containing layer 41 deposited on the resist pattern 35 is selectively removed together with the resist pattern 35. Specifically, the lift-off is carried out. As schematically shown by arrows in FIG. 9C, the resist pattern 35 is removed by irradiating an energy beam, an excimer laser beam having a wavelength of 308 nm in this embodiment, thereon from the side of the impurity containing layer 41.

Figure 9D:
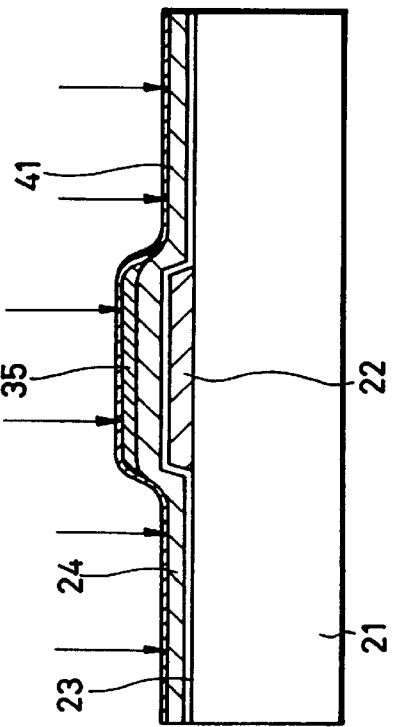

In this arrangement, as shown in FIG. 9D, similarly to the above embodiment, since the impurity containing layer 41 has property to absorb or transmit the excimer laser beam, the resist pattern 35 made of an organic material can be ablated and hence removed. Consequently, the impurity containing layer 41 on the resist pattern 35 is selectively removed. Specifically, also in this embodiment, the impurity containing layers 41 are separated and left at positions located across the gate electrode 22 at both of the edge portions of the gate electrode 22 in the longitudinal direction.

Then, similarly to the first embodiment, as shown in FIG. 10A, an intrinsic or low-concentration semiconductor layer 42 formed of an amorphous semiconductor layer having sufficiently low impurity concentration as compared with the impurity containing layer 41 is entirely formed thereon by the PECVD, for example.

Then, as schematically shown by arrows in FIG. 10A, heat treatment is carried out by irradiating rays of excimer laser light, for example, plural times, thereby the semiconductor layer 42 being crystallized to be a polycrystalline semiconductor layer. At this time, impurities in the impurity containing layer 41 are diffused into the intrinsic or low-concentration semiconductor layer 42 formed on the impurity containing layer 41 in contact therewith, and the impurities are activated. As shown in FIG. 10B, source and drain regions 26s and 26d are formed.

Then, the semiconductor layer 42 exposed to the outside is subjected to hydrogenation processing, e.g., hydrogen introduction processing by hydrogen plasma irradiation. Then, heat treatment is applied to the semiconductor layer 42 to recover crystals of the semiconductor layer 42 damaged by the plasma irradiation. When SiN, though not shown, is deposited on a surface of the semiconductor layer 42 in this treatment, as described above, hydrogen can be prevented from being diffused again and introduction of hydrogen from the SiN reliably improves and stabilizes characteristics of the semiconductor layer 42.

As described above, it is possible to obtain the desired thin film transistor in which, as shown in FIG. 10B, a channel forming portion is formed in the intrinsic or low-concentration semiconductor layer 42 formed on the gate electrode 22 through the gate insulating layer 24 and the source and drain regions 26s, 26d are formed at both sides of thereof. If a covering layer made of SiN or the like is formed on the source and drain regions 26s, 26d, then electrode contact windows are formed through the covering layer and the respective source and drain electrodes 27s, 27d are deposited on the source and drain regions 26s, 26d therethrough so as to have ohmic contacts. These electrodes 27s, 27d can be formed simultaneously by entire evaporation of metal and a succeeding pattern etching employing photolithography. Thus, the desired thin film transistor is formed.

While only in the third embodiment of the abovedescribed first to fifth embodiments the cleaning process, i.e., the cleaning process employing UV irradiation in the ozone atmosphere, for example, is carried out after the removal of the resist pattern 35, i.e., after the lift-off, it is desirable to carry out the cleaning process after the lift-off process in other embodiments.

In each of the first to fifth embodiments, when the impurity containing layer 41 and the semiconductor layer 42 are annealed, i.e., are crystallized by irradiating rays of laser light thereon and the impurities are activated, if pulsed rays of laser light, e.g., of excimer laser light are irradiated thereon plural times, then it is possible to obtain impurity concentration distribution of the source and drain regions in which impurity concentration is gradually decreased toward the channel forming portion, and hence it is possible to arrange a so-called lightly doped drain (LDD) type transistor.

According to each of the first to fifth embodiments of the present invention, since the photoresist pattern 35 is formed with the gate electrode 22 being employed as the exposure mask and the impurity-doped semiconductor layer 41 or 42 is formed in the pattern with the photoresist pattern 35 being employed as the mask for the lift-off, the alignment between the source and the drain is achieved, i.e., the channel forming portion and the gate electrode are self-aligned with each other. Therefore, it is possible to reduce the parasitic capacitance between the source and drain and the gate, and it is possible to arrange the transistor with an excellent switching characteristic and an excellent high-frequency characteristic. Since such self-alignment is achieved, it is possible to manufacture the transistor having the desired characteristics with satisfactory reproducibility and a satisfactory yield.

Moreover, according to the embodiments of the present invention, it is possible to arrange the offset-type transistor as described above.

According to the embodiments of the present invention, since, upon the hydrogenation processing for the semiconductor layer, there is no insulating layer as employed in the arrangement shown in FIG. 1 especially on the channel forming portion to be reliably subjected to the hydrogenation processing, hydrogen can be reliably introduced to the semiconductor layer for a short period of time, which provides the stable and uniform characteristics of the semiconductor layer and improves the workability.

Since the heat treatment for the impurity containing layer 41 and the semiconductor layer 42, i.e., the heating (annealing) processing for crystallizing these semiconductor layers 41, 42 and diffusing and activating the impurities by the excimer laser light irradiation, for example, is carried out commonly and simultaneously, it is possible to reduce the number of the complicated manufacturing processes.

Figure 1A:
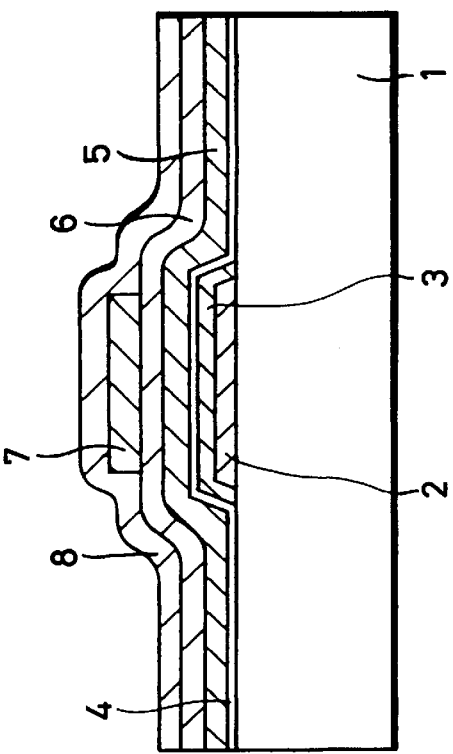
FIGS. 1A to 1C are cross-sectional views showing a thin film semiconductor device, used to explain processes of manufacturing the same.
Figure 1B:
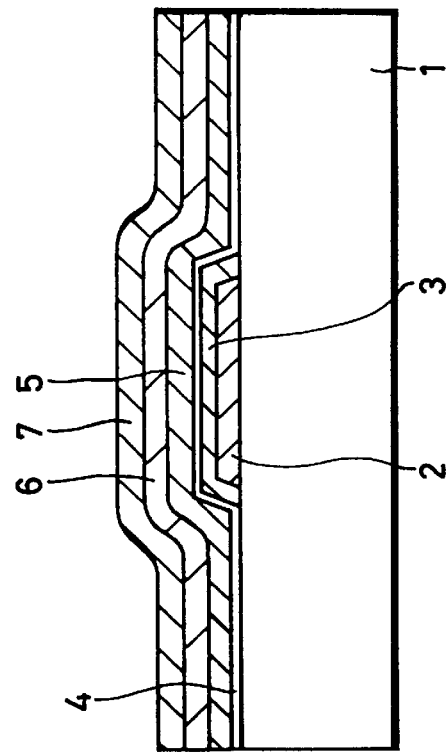
Figure 1C:
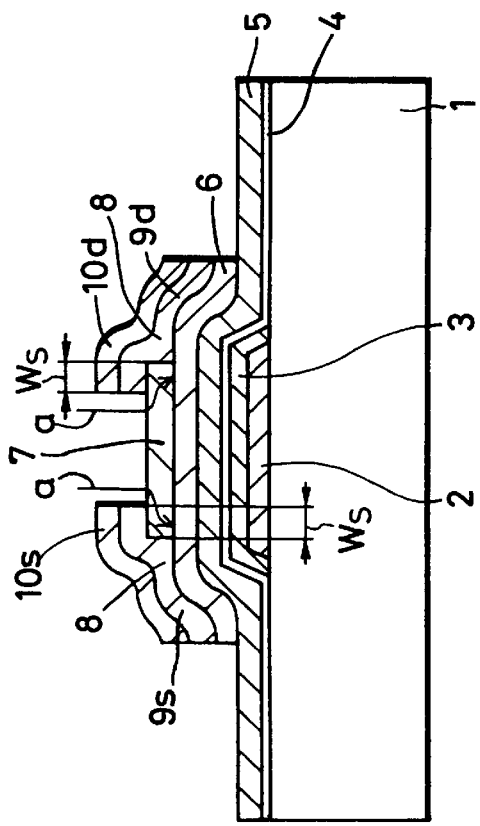

It is possible to avoid the two $SiO_2$-layer forming processes of forming the gate insulating film 5 and forming the insulating layer 7 serving as the etching stopper for separating the source and the drain of the semiconductor layer as carried out in the arrangement shown in FIGS. 1A to 1C. Since it becomes unnecessary to employ the complicated processes for forming the insulating layer as the etching stopper in the predetermined pattern by the pattern etching employing the photolithography, it is possible to simplify the manufacturing process.

Moreover, since it becomes unnecessary to form the insulating layer as the etching stopper, it is possible to eliminate the disadvantage that the substrate is etched upon the pattern etching of the insulating layer.

While the transistors have the offset-type arrangement in the first to fifth embodiments, it is needless to say that the present invention can be applied to a transistor which does not have the offset-type arrangement. In this case, the work for extending the width $W_0$ by heating the resist patterning may be eliminated.

While only one thin-film-transistor forming portion is shown in the embodiments described with reference to the drawings, it is possible to form an integrated circuit having a plurality of thin film transistors, by simultaneously forming a plurality of thin film transistors on the common substrate 21. It is needless to say that it is possible to simultaneously form a plurality of single thin film transistors by dividing a plurality of thin film transistors thus formed.

As described above, according to the present invention, the stable and excellent process of the thin film can be carried out, and when the thin film semiconductor device is manufactured in accordance with the above process, it is possible to stabilize the characteristics thereof and improve the reproducibility thereof, and it is possible to obtain the thin film semiconductor device having high reliability. Therefore, since improvement of the yield, simplification of the manufacturing method, improvement of the workability and so on can be achieved, it is possible to achieve the excellent mass productivity and to reduce the manufacturing costs. Moreover, the present invention brings considerable industrial advantages such as facilitated fabrication of the offset-type transistor and the LDD transistor.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A method for making a thin film semiconductor device comprising the steps of:

providing a transparent substrate having an upper surface and an opposed lower surface;

forming a gate electrode on the upper surface having a width dimension;

forming an impurity shielding layer on the upper surface and exposed upper surface of the gate electrode;

forming a gate insulating film on the impurity shielding layer;

applying a photoresist layer on said gate insulating film;

exposing the substrate from the lower surface side to light to develop exposed portions of the photoresist layer;

removing exposed portions of the resist layer to provide a remaining unexposed resist portion above the gate electrode, said resist portion having a first width substantially equal to the width of the gate electrode;

heating and flowing the resist portion to provide a deformed resist portion having a second width greater than said first width;

forming a relatively higher concentration impurity containing first amorphous silicon layer on said deformed resist portion and adjacent portions of said gate insulating film;

removing the deformed resist portion and any overlying portions of the first impurity containing amorphous silicon layer to provide first and second separated portions of the impurity containing first amorphous silicon layer on opposed sides of the gate electrode and spaced from the gate electrode by an offset width;

forming a relatively lower concentration impurity containing second amorphous silicon layer on said first and second portions and exposed portions of said gate insulating film;

laser annealing to diffuse and activate impurities in said first and second amorphous silicon layers to define source and drain regions on opposite sides of the gate electrode and spaced from the gate electrode by an offset width; and thereafter, forming source and drain electrodes disposed in ohmic contact with said source and drain regions, respectively.

2. A method as defined in claim 1, further comprising the step of subjecting the second amorphous silicon layer to hydrogen plasma processing followed by a second laser annealing before forming said source and drain electrodes.

3. A method as defined in claim 2, further comprising the step of forming a SiN layer on the second amorphous silicon layer prior to hydrogen plasma processing and wherein the source and drain electrodes extend through openings formed in the SiN layer to make ohmic contact with the source and drain regions.

4. A method as defined in claim 1, wherein said transparent substrate comprises glass, quartz or plastic.

5. A method as defined in claim 1, wherein said gate electrode comprises a metal selected from the group consisting of Al, Mo and Ti.

6. A method as defined in claim 1, wherein said impurity shielding layer comprises SiN.

7. A method as defined in claim 1, wherein said gate insulating film comprises $SiO_2$.

8. A method as defined in claim 1, wherein said photoresist comprises an organic positive photoresist.

9. A method as defined in claim 1, wherein in the step of heating and flowing the resist portion to provide the deformed resist portion, the resist portion is heated at a temperature of about 140° C.

10. A method as defined in claim 1, wherein said first amorphous silicon layer is formed by plasma enhanced chemical vapor deposition at a temperature less than about 150° C.

11. A method as defined in claim 1, wherein the step of removing the deformed resist is performed by a wet process employing super ultrasonic vibration and acetone.

* * * * *